(12) United States Patent
St. Germain et al.

(10) Patent No.: US 9,870,986 B2
(45) Date of Patent: Jan. 16, 2018

(54) SINGLE OR MULTI CHIP MODULE PACKAGE AND RELATED METHODS

(71) Applicant: SEMICONDUCTOR COMPONENTS INDUSTRIES, LLC, Phoenix, AZ (US)

(72) Inventors: Stephen St. Germain, Scottsdale, AZ (US); Roger M. Arbuthnot, Mesa, AZ (US); Jay A. Yoder, Phoenix, AZ (US); Dennis Lee Conner, Glendale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/391,960

(22) Filed: Dec. 28, 2016

(65) Prior Publication Data

US 2017/0110391 A1    Apr. 20, 2017

Related U.S. Application Data

(63) Continuation of application No. 14/484,141, filed on Sep. 11, 2014, now Pat. No. 9,558,968.

(51) Int. Cl.
*H01L 23/498* (2006.01)
*H01L 23/495* (2006.01)
(Continued)

(52) U.S. Cl.
CPC ...... *H01L 23/49805* (2013.01); *H01L 21/568* (2013.01); *H01L 23/3107* (2013.01); *H01L 23/49524* (2013.01); *H01L 23/49575* (2013.01); *H01L 23/49811* (2013.01); *H01L 23/49861* (2013.01)

(58) Field of Classification Search
CPC ................ H01L 23/49811; H01L 23/49524
See application file for complete search history.

(56) References Cited

U.S. PATENT DOCUMENTS

| | | |
|---|---|---|
| 2006/0186551 A1 | 8/2006 | Lange et al. |
| 2008/0217765 A1 | 9/2008 | Yoder et al. |
| 2009/0026628 A1 | 1/2009 | Lee et al. |

OTHER PUBLICATIONS

LFPAK The Toughest Power-SO8, published by NXP Semiconductors Netherlands N.V. of Eindhoven, The Netherlands at least as early as Mar. 17, 2010, available online at http://www.nxp.com/documents/leaflet/939775016838_LR.pdf.

(Continued)

*Primary Examiner* — Caleb Henry
*Assistant Examiner* — Mounir Amer
(74) *Attorney, Agent, or Firm* — IPTechLaw

(57) ABSTRACT

Implementations of a semiconductor device package may include: a plurality of electrical contacts on a first face of a die, at least one clip electrically and mechanically coupled with at least one electrical contact on a second face of the die where the second face of the die is on an opposing side of the die from the first face of the die. The at least one clip may include at least one lead in electrical communication with the at least one electrical contact on the second face of the die. A mold compound or an encapsulating compound may be included around the die and a majority of the at least one clip where a portion of the at least one lead and a portion of the plurality of electrical contacts on the first face of the die are not overmolded or encapsulated. The semiconductor package includes no lead frame.

17 Claims, 7 Drawing Sheets

(51) Int. Cl.
 *H01L 21/56* (2006.01)
 *H01L 23/31* (2006.01)

(56) References Cited

OTHER PUBLICATIONS

AND9137/D Universal Footprint for SO8FL Package, Published by Semiconductor Components Industries, LLC of Phoenix, AZ at least as early as Apr. 2013, available online at http://www.onsemi.com/pub_link/Collateral/AND9137-D.PDF.
AND8195/D Board Mounting Notes for SO8-Flat Lead, published by Semiconductor Components Industries, LLC of Phoenix, AZ at least as early as Apr. 2007, available online at http://www.onsemi.com/pub_link/Collateral/AND8195-D.PDF.

SINGLE OR MULTI CHIP MODULE PACKAGE AND RELATED METHODS

CROSS REFERENCE TO RELATED APPLICATIONS

This application is a continuation application of the earlier U.S. Utility patent application entitled "Single or Multi Chip Module Package and Related Methods," application Ser. No. 14/484,141, filed Apr. 11, 2014, naming as first inventor Stephen St. Germain, now pending, the disclosure of which is hereby incorporated entirely herein by reference.

BACKGROUND

1. Technical Field

Aspects of this document relate generally to semiconductor device packaging.

2. Background

Semiconductor devices are often encased within (or partly within) a package prior to use. Some packages contain a single die while others contain multiple die. The package often offers some protection to the die, such as from corrosion, impact and other damage, and often also includes electrical leads or other components which connect the electrical contacts of the die with a motherboard. The package may also include components configured to dissipate heat from the die into a motherboard or otherwise away from the package.

SUMMARY

Implementations of a method of forming a semiconductor device package may include: providing an adhesive tape; contacting at least one electrical contact of at least one die with an adhesive surface of the adhesive tape; mechanically and electrically coupling at least one clip with the at least one die and contacting an electrical contact of the at least one clip with the adhesive surface; one of overmolding and encapsulating the at least one die and a majority of the at least one clip with one of a mold compound and an encapsulating compound, respectively, wherein the at least one electrical contact of the at least one die and the electrical contact of the at least one clip are not one of overmolded and encapsulated, forming the semiconductor device package; and removing the semiconductor device package from the adhesive surface; wherein the at least one electrical contact of the at least one die and the electrical contact of the at least one clip are positioned to electrically couple with one or more conductive paths on a motherboard, the one or more conductive paths forming a distribution layer; and wherein the distribution layer is configured to distribute all electrical signals between the semiconductor device package and the motherboard.

Implementations of a method of forming a semiconductor device package may include: providing an adhesive tape; contacting a plurality of electrical contacts on a first face of a first die with an adhesive surface of the adhesive tape; one of overmolding and encapsulating the first die with one of a mold compound and an encapsulating compound, respectively, wherein a portion of the plurality of electrical contacts on the first face of the first die are not one of overmolded and encapsulated, forming the semiconductor device package; and removing the semiconductor device package from the adhesive surface; wherein the portion of the plurality of electrical contacts on the first face of the first die are positioned to electrically couple with one or more conductive paths on a motherboard, the one or more conductive paths forming a distribution layer; and wherein the distribution layer is configured to distribute all electrical signals between the semiconductor device package and the motherboard.

Implementations of a method of forming a semiconductor device package may include one, all, or any of the following:

Contacting at least one electrical contact on a first face of a second die with the adhesive surface; mechanically and electrically coupling a first clip with an electrical contact on a second face of the second die where the second face of the second die is on an opposing side of the second die from the first face of the second die; contacting an electrical contact of the first clip with the adhesive surface; and one of overmolding and encapsulating the second die and a majority of the first clip with the one of the mold compound and encapsulating compound, respectively, wherein the at least one electrical contact on the first face of the second die and the electrical contact of the first clip are not one of overmolded and encapsulated.

The first clip may be one of bonded and soldered to the second face of the second die.

The distribution layer may be configured to distribute all electrical communications between the first die and the second die.

Contacting at least one electrical contact on a first face of a third die with the adhesive surface; mechanically and electrically coupling a second clip with an electrical contact on a second face of the third die, the second face of the third die on an opposing side of the third die from the first face of the third die; contacting an electrical contact of the second clip with the adhesive surface; and one of overmolding and encapsulating the third die and a majority of the second clip with the one of the mold compound and encapsulating compound, respectively, wherein the at least one electrical contact on the first face of the third die and the electrical contact of the second clip are not one of overmolded and encapsulated.

The distribution layer may be configured to distribute all electrical communications between the first die, the second die and the third die.

The second clip may be positioned to electrically couple the second die with the third die through the one or more conductive paths included in the motherboard.

The electrical contact of the second clip may be positioned to electrically couple with the one or more conductive paths included in the motherboard.

The semiconductor device package may include no wire bonds.

The semiconductor device package may include no leadframe.

The distribution layer may be configured to distribute a majority of electrical signals between the plurality of electrical contacts on the first face of the first die.

Coupling the semiconductor device package with the motherboard.

Implementations of a method of forming a semiconductor device package may include: providing an adhesive tape; contacting a plurality of electrical contacts on a first face of a first die or a passive component with an adhesive surface of the adhesive tape; one of overmolding and encapsulating the first die or the passive component with one of a mold compound and an encapsulating compound, respectively, wherein a portion of the plurality of electrical contacts on the first face of the first die or the passive component are not one of overmolded and encapsulated, forming the semiconductor device package, the semiconductor device package including no leadframe; and removing the semiconductor device package from the adhesive surface; wherein the portion of the plurality of electrical contacts on the first face of the first die or the passive component are positioned to electrically couple with one or more conductive paths included in a motherboard, the one or more conductive paths forming a distribution layer; and wherein the distribution layer is configured to distribute all electrical signals between the semiconductor device package and the motherboard.

Implementations of a method of forming a semiconductor device package may include one, all, or any of the following:

The semiconductor device package may include no wire bonds.

Implementations of a method of forming a semiconductor device package may include: providing an adhesive tape; contacting a plurality of electrical contacts on a first face of a die with an adhesive surface of the adhesive tape; electrically and mechanically coupling at least one clip with at least one electrical contact on a second face of the die, the second face of the die on an opposing side of the die from the first face of the die, the at least one clip including at least one lead in electrical communication with the at least one electrical contact on the second face of the die; contacting the at least one lead with the adhesive surface; one of overmolding and encapsulating the die and a majority of the at least one clip with one of a mold compound and an encapsulating compound, respectively, wherein a portion of the at least one lead and a portion of the plurality of electrical contacts on the first face of the die are not one of overmolded and encapsulated, forming the semiconductor device package; and removing the semiconductor device package from the adhesive surface.

Implementations of a method of forming a semiconductor device package may include one, all, or any of the following:

The plurality of electrical contacts on the first face of the die may include one of pads and bumps.

The semiconductor device package may include no wire bonds.

The semiconductor device package may include no leadframe.

Mechanically coupling the at least one clip with the at least one electrical contact on the second face of the die may further include one of bonding and soldering the at least one clip with the at least one electrical contact on the second face of the die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor device packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor device packages and related methods, and implementing components and methods, consistent with the intended operation and methods.

Figure 12:
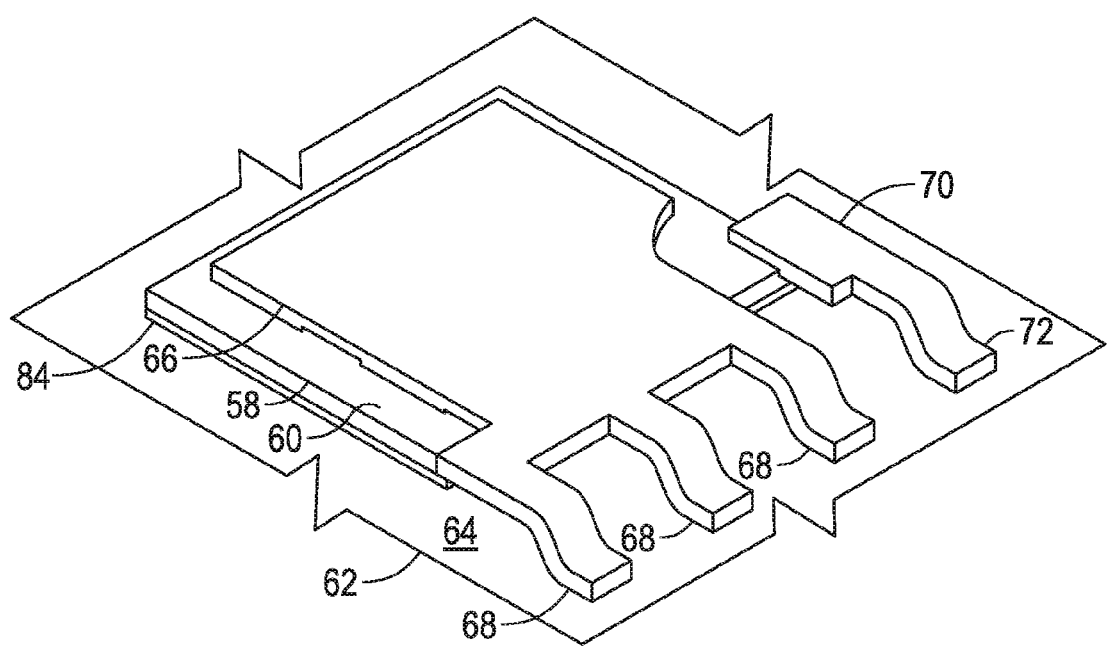
FIG. 12 is a top perspective view of elements of an implementation of a semiconductor device package adhered to an adhesive surface of an adhesive tape.
Figure 13:
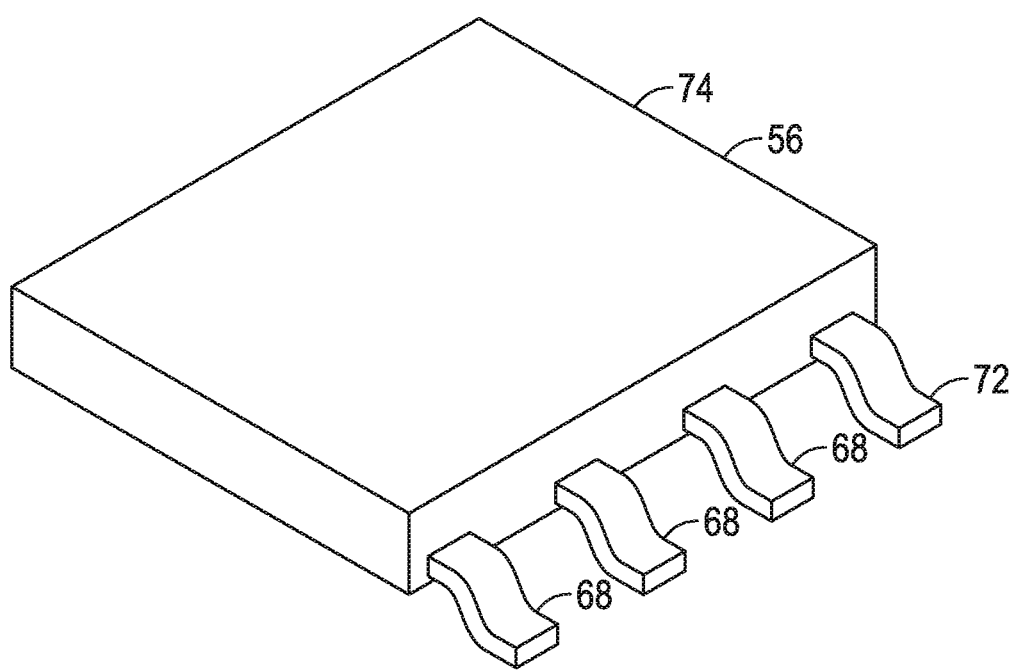
FIG. 13 is a top perspective view of an implementation of a semiconductor device package.

Referring now to FIGS. 1-11, in implementations a semiconductor device package 2 includes one or more semiconductor die (die) 6, 12, 20, and/or 34, one or more clips 46 and/or 50, and a mold compound (encapsulating compound) 54. Referring to FIGS. 12-13, in various implementations a semiconductor device package 56 includes a semiconductor die (die) 58, one or more clips 66 and/or 70 having leads 68 and/or 72, and a mold compound (encapsulating compound) 74.

Figure 1:
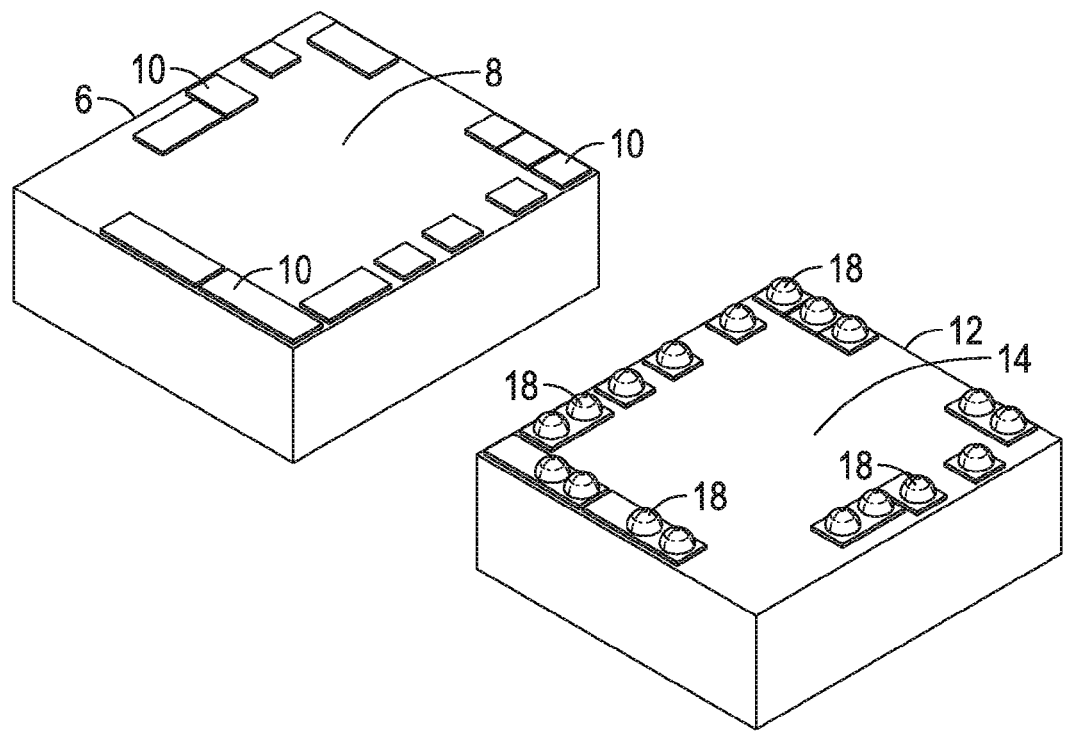
FIG. 1 is a top perspective view of two implementations of die of a semiconductor device package.
Figure 2:
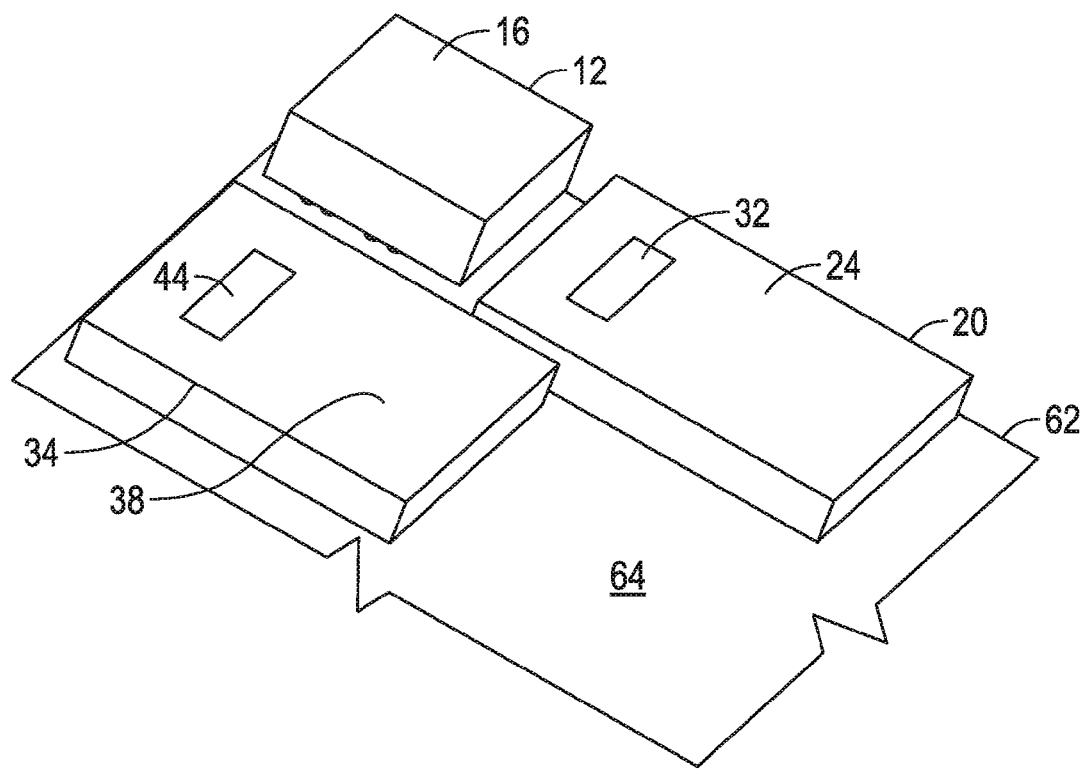
FIG. 2 is a top perspective view of three implementations of die of a semiconductor device package adhered to an adhesive surface of an adhesive tape.
Figure 3:
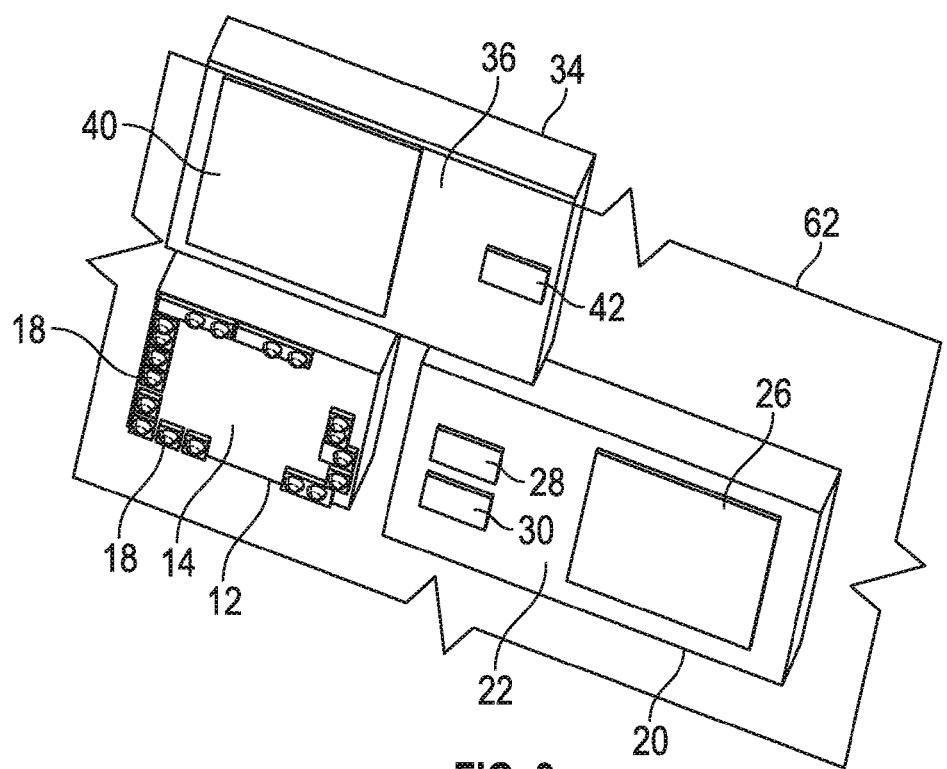
FIG. 3 is a bottom perspective view of the die and adhesive tape of FIG. 2 with the adhesive tape drawn in see-through fashion so that the bottom surfaces of the die may be viewed.

Referring now to FIGS. 1 and 2, implementations of semiconductor packages disclosed herein are formed using implementations of a method of forming a semiconductor device package 2. The method 2 includes placing a die 12 on an adhesive surface 64 of an adhesive tape (mold tape) 62. Die 12 includes a plurality of electrical contacts 18 on a first face 14. The electrical contacts 18 on the die 12 shown in the drawings are bumps (stud bumps). In implementations a semiconductor device package could include a die 6 which is generally similar, or in some cases identical, to die 12, except that the electrical contacts 10 on the first face 8 of die 6 are pads instead of bumps.

In implementations a semiconductor device package may include only a single die, as in the semiconductor device package 56 of FIG. 13, for example, which includes (referring to FIG. 12) only a single die 58. In implementations of making such a package, the method includes placing the single die 58 so that electrical contacts on a first face of the die 58 contact the adhesive surface 64 of the adhesive tape 62. A clip 66 is mechanically and electrically coupled to one or more electrical contacts on a second face 60 of the die 58 and placed so that leads 68 of the clip 66 contact the adhesive surface 64. The second face 60 of the die 58 is on an opposing side of the die 58 from the first face of the die 58. In the implementation shown a clip 70 is also included which is mechanically and electrically coupled to one or more electrical contacts on the second face 60 of the die 58 and placed so that a lead 72 of the clip 70 contacts the adhesive surface 64. In other implementations only a single clip could be used instead of a clip 66 and a clip 70 and/or the clip(s) could have different configurations—for instance the semiconductor device package could contain more or less leads such as one, two, three, five, six, seven, or more leads. In the implementation shown if FIGS. 12-13 the leads are gull-wing leads but in other implementations they could have any other shape and configuration, for instance the package could be formed so that the leads 68, 72 are substantially flush with the outer faces of the package to form a flat no-leads package. Additionally, in the implementation shown in FIGS. 12-13 all of the leads exit the same side face of the semiconductor device package 56 but, in other implementations, the clips could be configured so that the leads exit two opposing side faces (such as, by non-limiting example, to form a dual in-line package (DIP or DIL)), or so that the leads exit three side faces, or so that the clips exit four side faces (such as, by non-limiting example, to form a quad flat package (QFP)).

In various implementations a semiconductor device package may include a plurality of die. Referring to FIG. 2, a die 12 is positioned so that electrical contacts 18 on a first face 14 of the die 12 contact the adhesive surface 64, a die 20 is positioned so that contact 26 and electrical contacts 28 and 30 on a first face 22 of the die 20 contact the adhesive surface 64, and die 34 is positioned so that contact 40 and electrical contact 42 on a first face 36 of the die 34 contact the adhesive surface 64. Contacts 26 and 40 in the implementations shown are electrical contacts, though in implementations they could be additionally or alternatively heat sinks and/or other heat transfer structures/devices could be located on the first faces 14, 22, 36 to transfer heat from the die to a motherboard.

Die 20 includes an electrical contact 32 on a second face 24 which is on an opposing side of the die 20 from the first face 22. Die 34 includes an electrical contact 44 on a second face 38 which is on an opposing side of the die 34 from the first face 36. Die 12 has a second face 16 which is on an opposing side of the die 12 from the first face 14. In the implementations shown there are no electrical contacts on the second face 16 of die 12 (and in fact all of the electrical contacts of the die 12 are on the first face 22), though in other implementations the second face 16 could include electrical contacts and/or one or more or all of the side faces of the die 12 could include electrical contacts and/or heat sinks to allow external elements such as clips to electrically and/or mechanically couple thereto to allow communication between the integrated circuit (IC) elements of the die 12 with other elements. Similarly, although only one electrical contact (32 or 44) is shown on the second face (23 or 38) of each of die 20 and 34, respectively, in other implementations a plurality of electrical contacts and/or heat sinks could be present on those faces and/or on other faces of those die.

Figure 4:
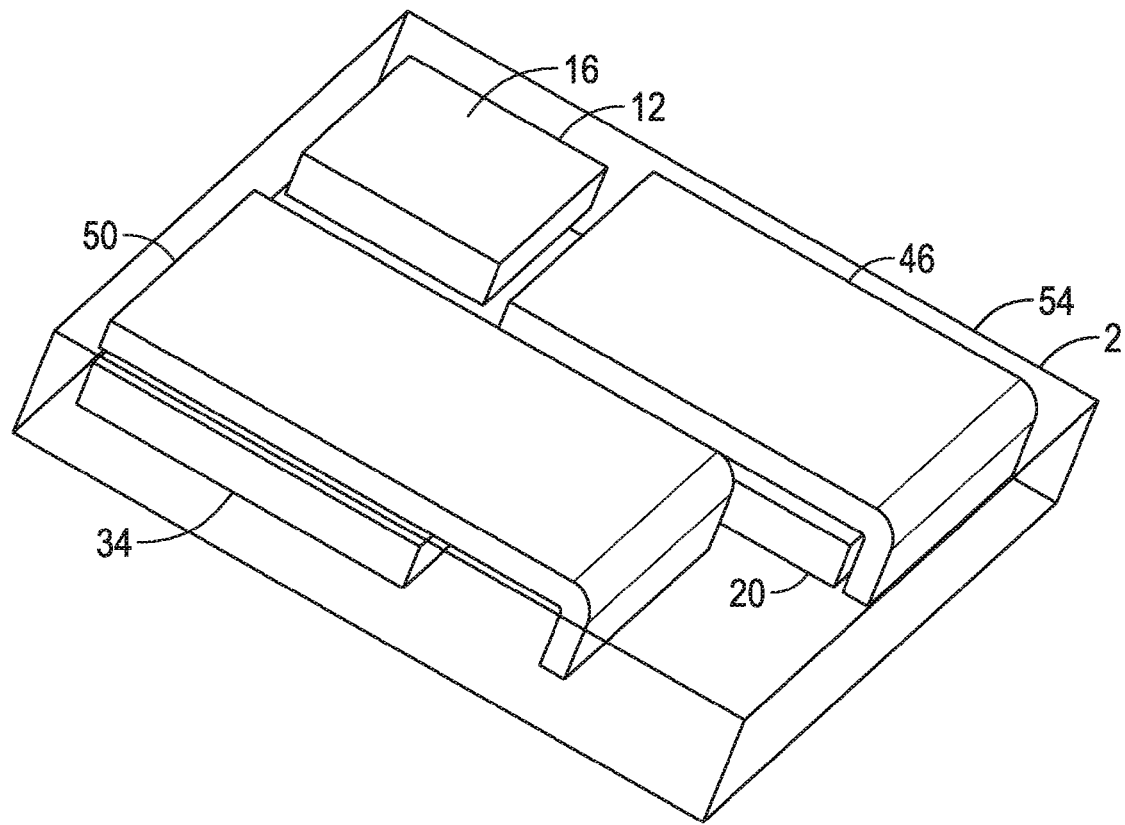
FIG. 4 is a top perspective view of an implementation of a semiconductor device package with the mold compound drawn in see-through fashion so that other elements may be viewed.
Figure 5:
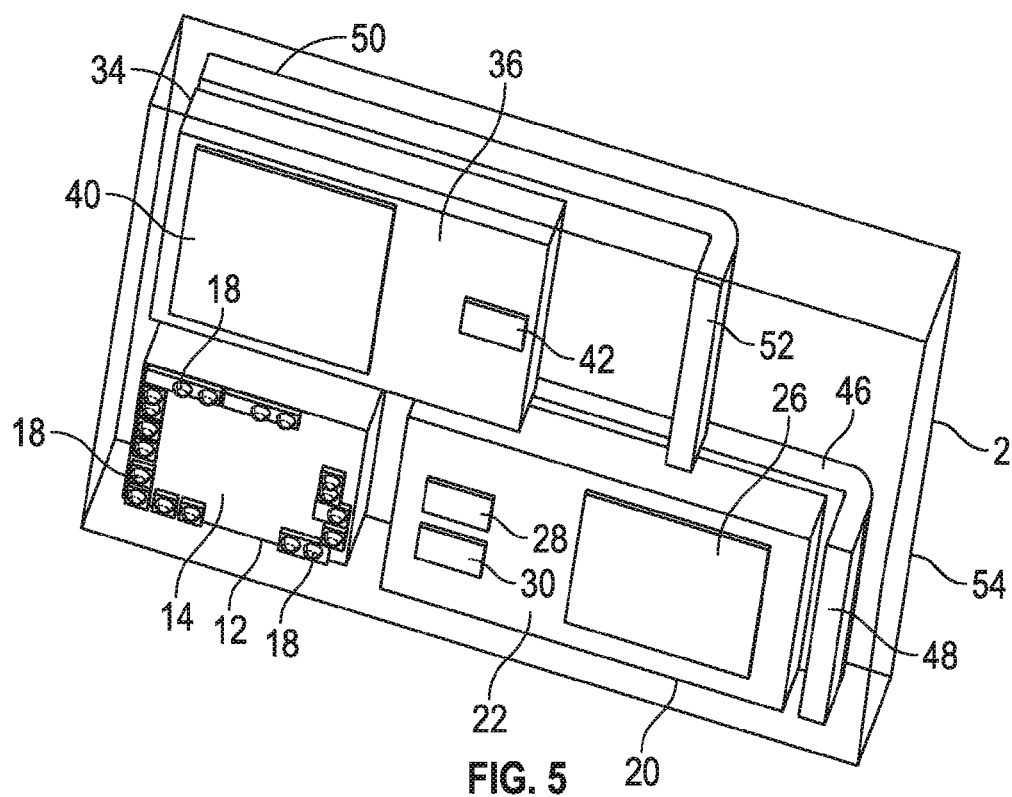
FIG. 5 is a bottom perspective view of the semiconductor device package of FIG. 4 with the mold compound drawn in see-through fashion so that other elements may be viewed.
Figure 6:
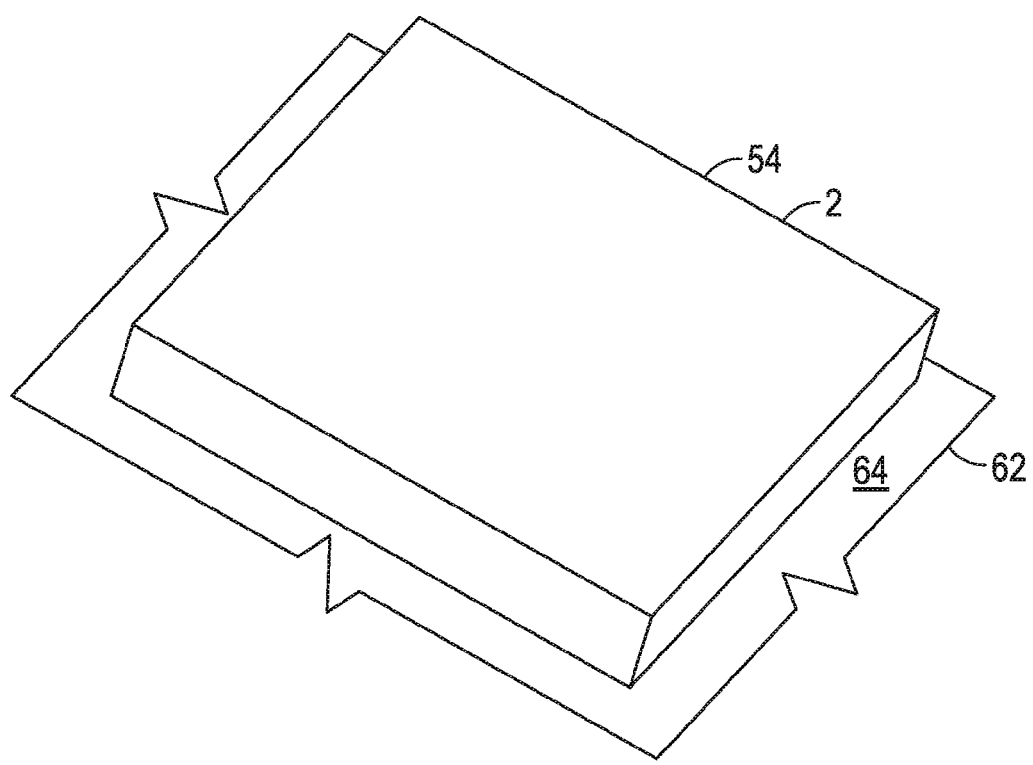
FIG. 6 is a top perspective view of the semiconductor device package of FIG. 4 adhered to an adhesive surface of an adhesive tape with the mold compound drawn in opaque fashion.

FIG. 4 shows clips 46 and 50 electrically coupled to die 20 and 34, respectively. Clip 46 is mechanically and electrically coupled to one or more electrical contacts (for example electrical contact 32) on the second face 24 and clip 50 is mechanically and electrically coupled to one or more electrical contacts (for example electrical contact 44) on the second face 38. Clip 46 may also be mechanically coupled, generally, to the second face 24 and clip 50 may also be mechanically coupled, generally, to the second face 38. The mechanical and electrical coupling may be accomplished, by non-limiting example, by a soldering process or by an adhesive process such as with an electrically conductive adhesive. Referring to FIG. 5, clip 46 has an electrical contact 48 which contacts the adhesive surface 64 and clip 50 has an electrical contact 52 which contacts the adhesive surface 64. After the clips are placed and are mechanically and electrically coupled to the electrical contacts of the respective die, a mold or encapsulating compound 54 is overmolded or encapsulated over the various elements in a liquid form and allowed to solidify. In implementations a single unit of compound 54 may be placed over a single group of elements to form a single semiconductor device package 2, for example as shown in FIGS. 4-8 (such as in punch singulation), though in other implementations a plurality of semiconductor device packages 2 could be formed on a single piece of adhesive tape 62 for example by placing down on the adhesive surface 64 a multitude of die and clips, overmolding or encapsulating the multitude of die and clips and then cutting or otherwise singulating each individual package 2 through a cutting, sawing or other separation process.

Figure 7:
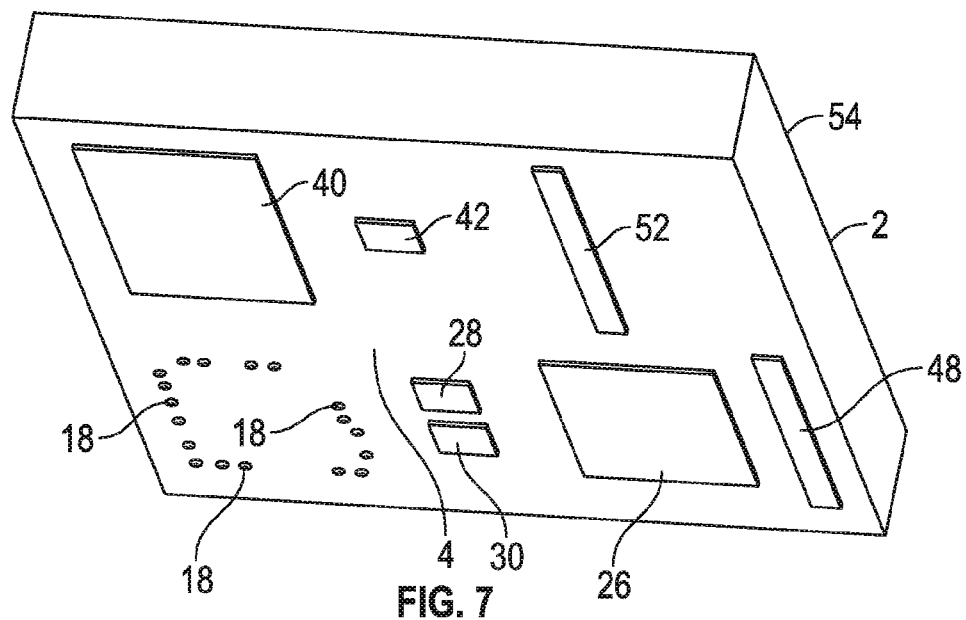
FIG. 7 is a bottom perspective view of the semiconductor device package of FIG. 5 with the mold compound drawn in opaque fashion.

In various implementations, the mold/encapsulating compound 54 is overmolded or placed so that it covers all of the elements of the package 2 except for a plurality of contacts on a first face 4 of the package 2. Referring to FIG. 7, for instance, the package 2 only has electrical contacts on a first face 4 of the package 2 which, after the overmolding or encapsulating process, is facing the adhesive surface 64. The package 2 is then removed from the adhesive surface 64 to reveal or otherwise expose the contacts. The FIG. 7 implementation of package 2 shows that the following contacts are exposed through the first face 4 of the package 2: contacts 40 and 28 (which in the implementations shown are electrical contacts but which in other implementations may additionally or alternatively be heat sinks), electrical contacts 28, 30, 42, 48, 52, and a number of electrical contacts 18 (not all of the electrical contacts 18 are numbered in the drawings but all of them have the same general shape, as all are bumps in the representative example). The package 2 thus may be a flat no-leads package. In various method implementations, a package could similarly be formed into a quad flat no-leads package (QFN) configuration, a dual flat no leads (DFN) package configuration, a micro leadframe (MLP) configuration, a small-outline no leads (SON) configuration, and many other package types.

For a package which includes no leads, such as package 2, the overmolding or encapsulating process may include encapsulating or overmolding the elements of the package 2 except for the first faces of the die which are facing the adhesive surface 64 (such as the first faces 8, 14, 22, 36), and overmolding a majority of the clips (or all of the clips except for the electrical contacts 48, 52) while leaving the contacts and electrical contacts of the first faces 8, 14, 22 and/or 36 exposed. The overmolding or encapsulating process may alternatively include overmolding or encapsulating a portion of the first faces 8, 14, 22 and/or 36 but without overmolding or encapsulating the electrical contacts on the first faces 8, 14, 22 and/or 36 (for example if the contacts/electrical contacts include pads or stud bumps which extend sufficiently outwards from the first faces 8, 14, 22 and/or 36 such a process may be utilized to cover the first faces 8, 14, 22 and/or 36 except for the contacts/electrical contacts).

For a package which includes leads, such as package 56, the overmolding or encapsulating process may similarly include encapsulating or overmolding the elements of the package 56 except for the first face of die 58 (which is on an opposing side of the die 58 from a second face 60 of the die 58), and overmolding a majority of the clips 66, 70 while leaving the leads 68, 72 and the electrical contacts on the first face of the die 58 exposed. The overmolding or encapsulating process may alternatively include overmolding or encapsulating a portion of the first face of the die 58 but without overmolding or encapsulating the electrical contracts on the first face of the die 58, similar to the process described above for package 2.

Thus, in various implementations the contacts and electrical contacts of the die and clips are not overmolded and are not encapsulated in the overmolding/encapsulating process. The overmolding or encapsulating compounds 54, 74 may be, or may include, by non-limiting example, a thermosetting or thermoplastic polymer, a thermosetting resin, an epoxy resin, and other polymeric or composite flowable materials.

In the implementations illustrated, all of the electrical (and any heat sink) contacts of the package 2 are exposed only through the first face 4. In other implementations a semiconductor device package could have, additionally, electrical and/or heat sink contacts exposed through any other face of the package and/or may include leads extending substantially past a face so that they are substantially not flush with the face, similar to how the leads 68/72 of package 56 extend substantially past the side face from which they exit so that they are not substantially flush with the side face. In contrast, all of the contacts and electrical contacts shown in the FIG. 7 implementation of package 2 are at least substantially flush with the first face 4 of package 2.

Figure 8:
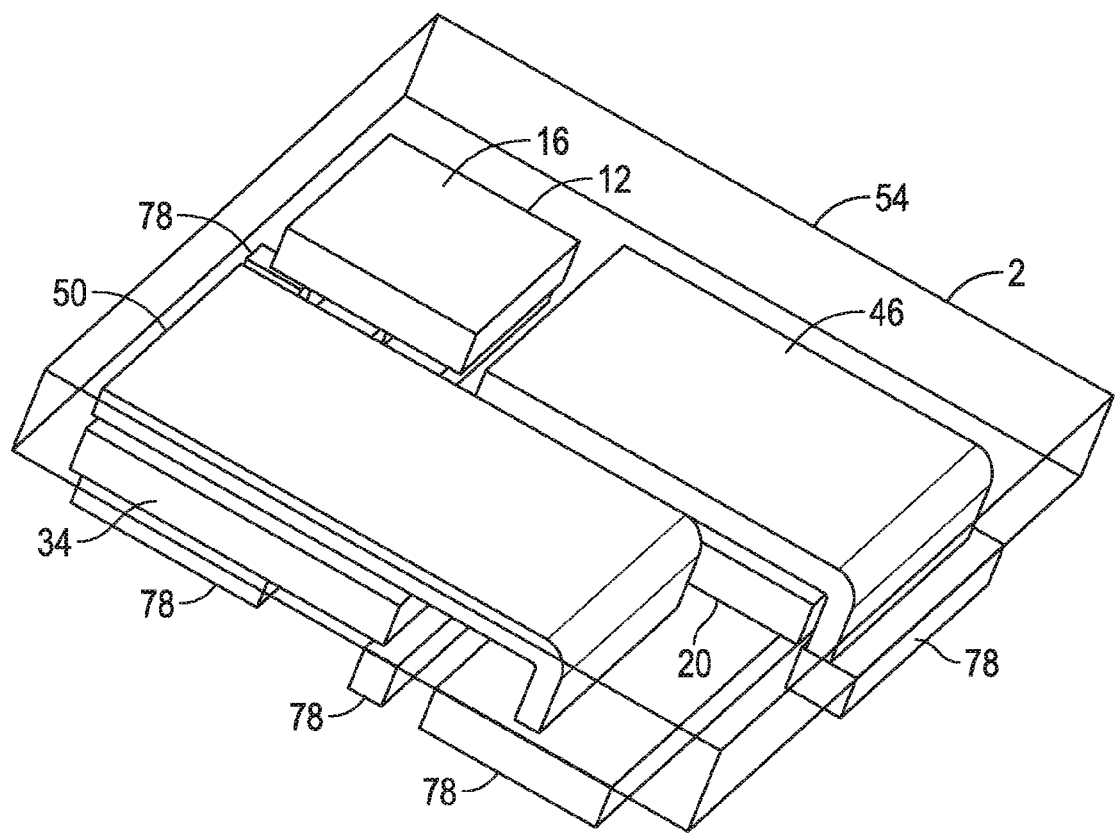
FIG. 8 is a top perspective view of the semiconductor device package of FIG. 4 and a plurality of conductive paths of a motherboard, with the mold compound drawn in see-through fashion so that other elements may be viewed.
Figure 9:
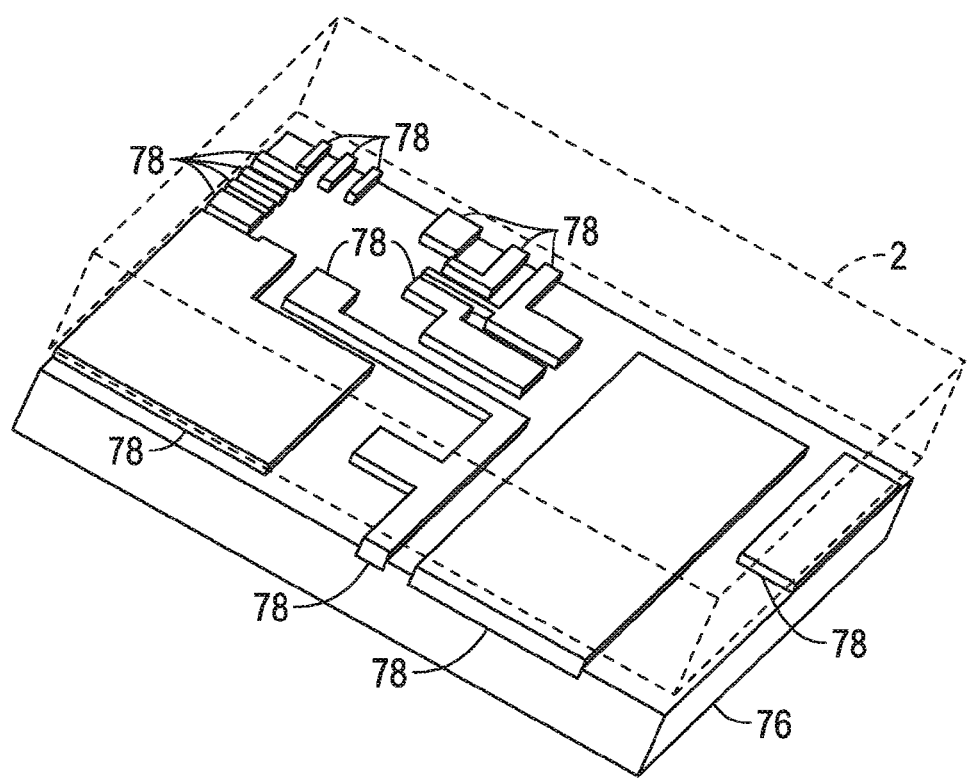
FIG. 9 is a top perspective view of a motherboard with conductive paths, with a dashed outline showing the location of a semiconductor device package on the motherboard.
Figure 10:
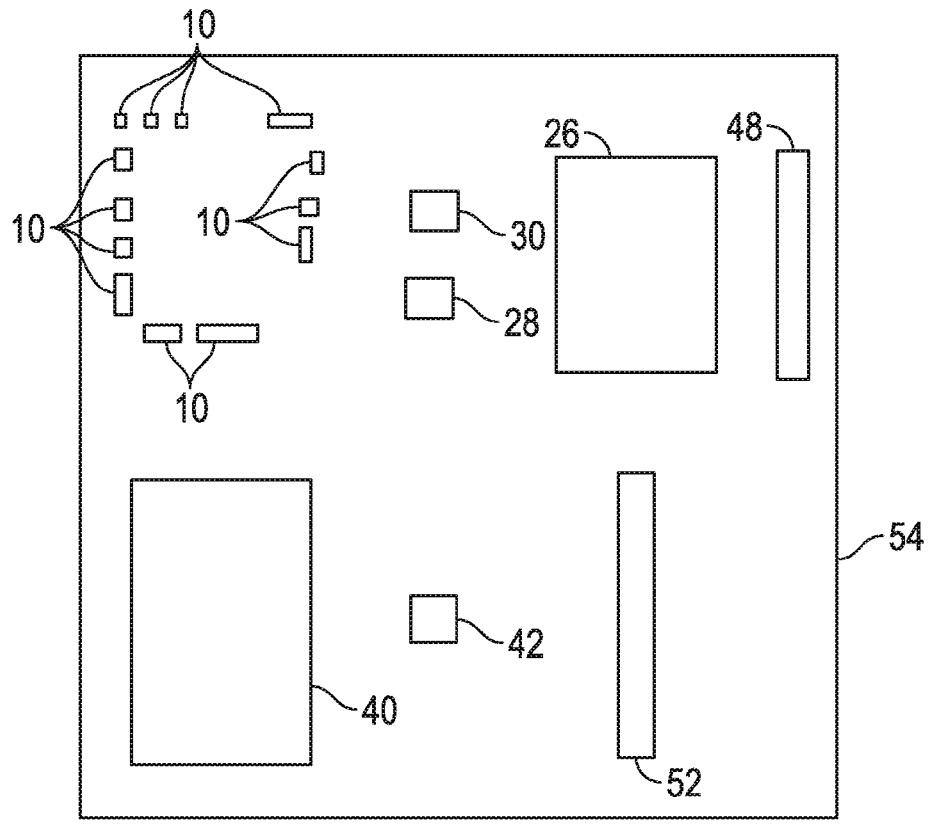
FIG. 10 is a top see-through view of a semiconductor device package showing only the mold compound and various contacts on the bottom of the semiconductor device package.
Figure 11:
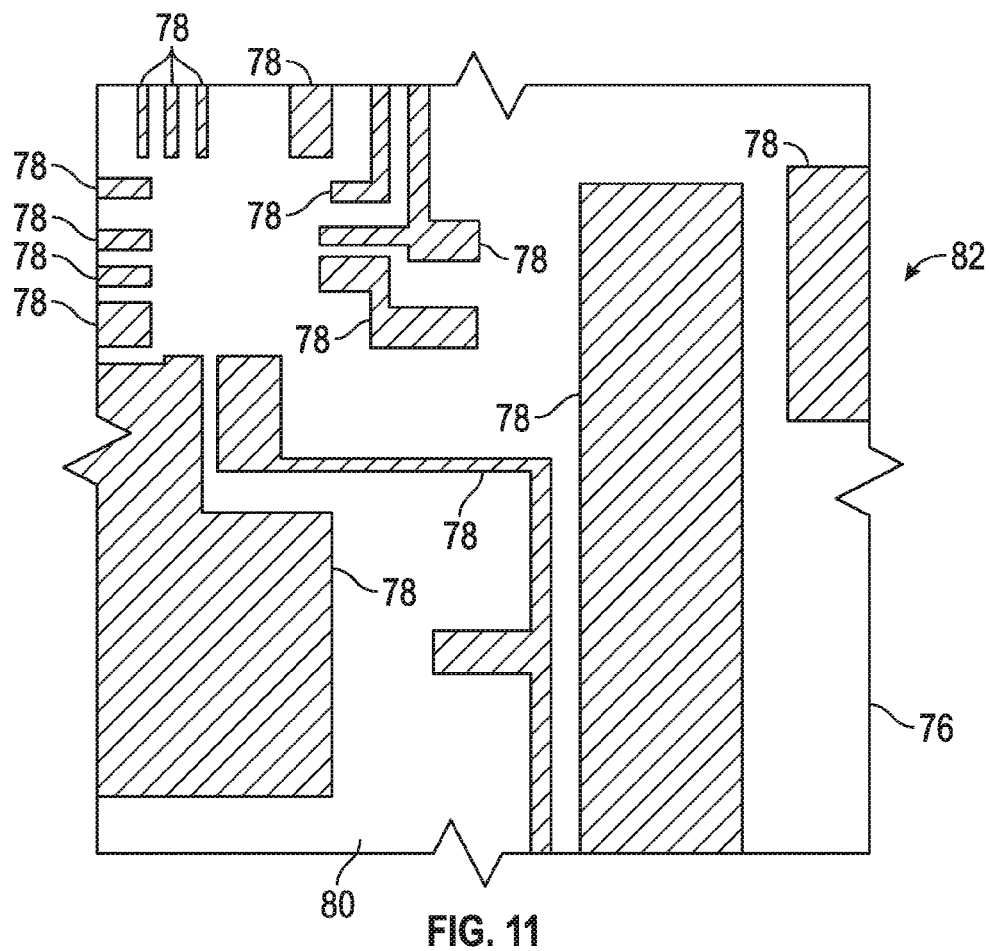
FIG. 11 is a top view of a distribution layer of a motherboard.

As shown in FIGS. 7-11, the electrical contacts shown in FIG. 7 are configured to align with conductive paths 78 on an upper face 80 of a motherboard 76. FIG. 9 is a top perspective view of a motherboard 76 with conductive paths 78, with a dashed outline showing the location of the package 2 on the motherboard 76. FIG. 10 is a top see-through view of a semiconductor device package similar to package 2 but which includes die 6 in place of die 12, the figure showing only the mold compound 54, contacts 26, 40 and electrical contacts 10, 26, 28, 30, 42, 48, 52. FIG. 11 shows a top view of a distribution layer 82 of a motherboard 76 including the conductive paths 78 located on the upper face 80, the distribution layer 82 configured to electrically couple each of the contacts and electrical contacts shown in FIG. 10 to at least one conductive path 78. The practitioner may envision how the contacts/electrical contacts shown in FIG. 10 align with the conductive paths 78 of FIG. 11 when the package is placed on the motherboard 76. The contacts and electrical contacts of the package 2/56 may be electrically and mechanically coupled to the conductive paths 78 of the distribution layer 82, by non-limiting example, using a soldering process or by an adhesion process such as with an electrically conductive adhesive.

As can be seen in FIG. 8, in implementations one or more of the clips may be configured to couple die together through the motherboard 76. Clip 50 of FIG. 8 is shown electrically coupling die 34 with die 20 through one of the conductive paths 78.

In implementations package 2 includes a driver metal-oxide-semiconductor field-effect transistor (DrMOS). The package 2 may be configured to perform high-current DC-DC buck power conversion applications. In implementations package 2 includes a metal-oxide-semiconductor field-effect transistor (MOSFET) driver, a high-side MOSFET (HS-FET) and a low-side MOSFET (LS-FET). Die 6/12 may be a driver and may have a size of, or of about, 0.86 mm by 0.94 mm by 0.2032 mm. Die 20 may be a HS-FET and may have a size of, or of about, 1.55 mm by 1.22 mm by 0.106 mm. Die 34 may be a LS-FET and may have a size of, or of about, 1.44 mm by 1.33 mm by 0.1016 mm. Clips 46 and 50 may be formed clips each having a thickness of, or of about, 0.125 mm. Molding/encapsulation compound 54 may be, or may include, an epoxy resin sold under the trade name G770 SERIES and/or G770HCD by Sumitomo Bakelite Co., Ltd. of Tokyo, Japan. Solder used to couple elements of package 56 together may be, or may include, an 85 wt % tin 15 wt % lead (SnPb 85/15) solder, or any other solder. Package 2 may have a size of, or of about, 3 mm by 3 mm by 0.5 mm.

In other implementations package 56 is a small outline 8-pin flat leads (SO8FL) package that includes no wire bonds and no leadframe. Die 58 may be or may include a MOSFET. Package 56 may have a size of, or of about, 6 mm by 5 mm by 0.5 mm. Die 58 may have a thickness of, or of about, 0.2032 mm, though the thickness may vary depending on the application. Clips 66 and 70 may each have thickness of, or of about, 0.125 mm. Molding/encapsulation compound 74 may be, or may include, an epoxy resin sold under the trade name G770 SERIES and/or G770HCD by Sumitomo Bakelite Co., Ltd. Solder used to couple elements of the package 56 together may be, or may include, an 85 wt % tin 15 wt % lead (SnPb 85/15) solder, or any other solder. Package 56 may be sized to be coupled to a motherboard that is configured to receive a 6 mm by 5 mm by 1 mm SO8FL package.

The adhesive tape 62 may be mold tape such as is currently used in molding processes for semiconductor packages that include leadframes. In implementations the electrical contacts of the die and other components may include copper pillars, bumps, pads and the like. These may be created and/or attached to die and other components prior to their placement on the adhesive tape 62. The adhesive tape 62 may be a high temperature tape that is held by a tape carrier (carrier ring) while die, discretes (capacitors, resistors, transistors, and any other electronic components each with just one circuit element, passive or active, other than an integrated circuit) and other components are placed, with electrical contacts down, on the adhesive tape 62. Solder may then be applied to the top of the die or other components, then the clips may be positioned and the solder reflowed to electrically and mechanically attach the clips to the die and/or other components. The array may then be molded in a transfer mold using mold compound 54 or 74. The molded array may be laser marked, and before or after laser marking the array may be removed from the adhesive tape 62. Following laser marking and removal of the array from the adhesive tape 62 the array may be sawed (saw singulation) or otherwise singulated using any separation technique. In implementations wherein a package is independently formed (punch singulation) the same or similar steps may be followed except for the sawing step which will be unnecessary.

In implementations a package after molding or encapsulating may leave a portion of one or more clips, or other components, exposed for the release of heat and/or to attach a heat sink thereto. For example, the sides/faces of the clips corresponding with (i.e., parallel or substantially parallel with and facing the same or substantially the same direction) the second faces 16, 24, 38, 60 of die may be exposed or partially exposed, and/or one or more of the second faces 16, 24, 38 and/or 60 themselves may be exposed or partially exposed, for this purpose. One or more die, clips or other components may be exposed in this manner for stacked package applications, i.e., package on package (PoP). In PoP implementations, leadframes, clips and/or wire bonds may be used to accomplish stacking amongst packages. Die, discretes and other components may also be stacked face up or down with other components within the package and/or may be used to bridge between components within a package and/or may or may not be exposed or partially exposed after molding or encapsulating. Components within or partially within a package such as those described herein may also be used to provide mechanical standoffs for the package relative to the motherboard or betwixt elements within the package. Methods such as those disclosed herein may be utilized for stacking chips/die and/or packages in system in package (SIP) modules.

In other implementations, no portion of the die(s) will be exposed after the molding or encapsulating process except for the portions on which the electrical contacts and/or heat sinks are present. In implementations one or more of the die, clips, or other elements may be formed such as to prevent or hinder the molding or encapsulating compound 54, 74 from tending to separate from the components within the molding or encapsulating compound 54, 74 (thus creating one or more mold locks). In implementations in which a portion of the first face(s) 4, 8, 14, 22, 36 and/or 58 is/are covered by the mold compound 54 or 74, as discussed herein, this may form one or more mold locks and in implementations with sufficient stand-off height of the electrical contacts there may be no exposed die surfaces in the finished package. In multichip module (MCM) packages any number and combination of die(s), field-effect transistors (FETs), clip(s), discrete(s), and/or other components, and the like, may be used.

The adhesive tape 62 could be, by non-limiting example: a map molding support tape sold under the trade name RT SERIES by Hitachi Chemical Co., Ltd. of Tokyo, Japan; a heat resistant tape sold under the trade name PW/TRM series by Nitto Denko Corporation of Osaka, Japan; and the like. In implementations the adhesive tape 62 may be or may include a thick tape with low-force ultraviolet (UV) release adhesive and other UV release tape types of other thicknesses as well.

All of the contacts, electrical contacts and conductive paths discussed herein may be formed of metals, metallic alloys, or other generally electrically conductive materials, as opposed to generally electrically non-conductive materials such as most ceramic and polymeric materials.

One of the basic and novel characteristics of implementations of semiconductor device packages 2, 56 disclosed herein is the exclusion of any wire bonds. Another of the basic and novel characteristics of implementations of semiconductor device packages 2, 56 disclosed herein is the exclusion of any leadframe. One of the basic and novel characteristics of implementations of a method of forming a semiconductor device package 2, 56 disclosed herein is the exclusion of a step of including a wire bond in the semiconductor device package 2, 56 or otherwise electrically coupling elements of the semiconductor device package 2, 56 using wire bonds. Another of the basic and novel characteristics of implementations of a method of forming a semiconductor device package 2, 56 disclosed herein is the exclusion of a step of including a leadframe in the semiconductor device package 2, 56.

The elimination of wire bonds, interconnects and leadframes from the packages discussed herein result in a number of beneficial effects, any one or more of which may exist in packages constructed using the methods disclosed herein: reduction cost and build time for the package; reduction of area and height needed for the package on a motherboard and/or within an electronic device; improvement of electrical performance by eliminating long route paths within the package; provision for a tightly controlled package footprint, and; allowance for connections typically made in the package through wire bonds, clips and carriers (such as leadframes) to be made instead on a motherboard.

The distribution layer 82 and package 2/56 in implementations are configured so that a majority, or all, of the electrical components internal to the package 2/56 that in prior art packages would be electrically coupled to one another using wire bonds and/or a leadframe are now electrically coupled to one another via the distribution layer 82 of the motherboard 76 without requiring any wire bonds and/or without requiring any leadframe to make the connections. The distribution layer 82 and package 2/56 are configured so that a majority, or all, of the electrical components internal to the package 2/56 that in prior art packages would be electrically coupled to one another using wire bonds and/or a leadframe are now electrically coupled to one another through the distribution layer 82 of the motherboard 76 and one or more clips without any wire bonds and without any leadframe. By non-limiting example the package 2 shown in the drawings is configured so that all but two of the package 2 interconnects are accomplished through the distribution layer 82, while the remaining two interconnects are accomplished using the clips 46, 50. In implementations in which a package includes more than one die, such as with package 2, the distribution layer 82 and the package may be configured so that the distribution layer 82 distributes all inter-die electrical communications.

In implementations the methods disclosed herein may be utilized to reduce the size or otherwise modify any existing quad flat no leads (QFN) package or to create a package that may be used in any QFN application. In various implementations, conductive solderable contacts are used for all components that are placed onto the adhesive tape 62 and all the contacts that are placed down on the adhesive tape 62 are built up to provide sufficient height to allow for a standoff for solder contact to the motherboard. This standoff, when applicable, may provide mold locks, standoff for board mount and component protection.

Implementations of semiconductor device packages, such as package 56 shown in FIGS. 12-13, may include a die pad or die flag 84, and implementations of methods of forming a package 56 may accordingly include mechanically and electrically coupling one or more electrical contacts on a first face of die 58 (which is on an opposite side of the die 58 from the second face 60 of the die 58) with the die flag 84. In other implementations of semiconductor device packages the die flag 84 may be omitted, and the method of coupling one or more electrical contacts on a first face of the die 58 to the die flag 84 may accordingly be omitted, such that electrical contacts on a first face of the die 58 are instead coupled directly to conductive paths of the motherboard. For purposes of this disclosure the die pad or die flag 84 is considered a leadframe. Accordingly, in implementations in which the die pad or die flag 84 is excluded, the package 56 accordingly includes no leadframe.

In various implementations, a semiconductor device package may include no die and/or may include one or more passive components such as, by non-limiting example: resistors; capacitors; inductors; memristors; transducers; sensors; antennas; networks of passive components; and other electrical circuit components. Implementations of semiconductor device packages which include passive components may be similar or the same as those shown in the drawings but may include one or more passive components where the one or more die are shown in the drawings.

Implementations of semiconductor packages disclosed herein may utilize implementations of a method of forming a semiconductor device package. Implementations of the method include: contacting a plurality of electrical contacts on a first face of a passive component with an adhesive of an adhesive surface of an adhesive tape (which may be any disclosed). The method also include overmolding or encapsulating the passive component with a mold compound or an encapsulating compound where a portion of the plurality of electrical contacts on the first face of the passive component are not one of overmolded and encapsulated, forming the semiconductor device package. The overmolding or encapsulating compound may be any disclosed herein. The semiconductor package includes no leadframe. The method also includes removing the semiconductor device package from the adhesive surface where the portion of the plurality of electrical contacts on the first face of the passive component are positioned to electrically couple with one or more conductive paths included in a motherboard. As disclosed in this document, the one or more conductive paths form a distribution layer designed to distribute all electrical signals between the semiconductor device package and the motherboard and various components contained thereon. In various implementations such a semiconductor device package includes no wire bonds, and it may also include multiple passive components, a mixture of one or more passive components and one or more die, and/or one or more clips as disclosed herein in relation to other implementations.

In places where the description above refers to particular implementations of semiconductor device packages and related methods and implementing components, sub-components, methods and sub-methods, it should be readily apparent that a number of modifications may be made without departing from the spirit thereof and that these implementations, implementing components, sub-components, methods and sub-methods may be applied to other semiconductor device packages and related methods.

What is claimed is:

1. A semiconductor device package consisting of:
   at least one die comprising at least one electrical contact;
   at least one clip comprising at least one electrical contact mechanically and electrically coupled with the at least one die;
   one of an overmolding or an encapsulating compound comprised around the at least one die and a majority of the at least one clip, wherein the at least one electrical contact of the at least one die and the electrical contact of the at least one clip are not one of overmolded and encapsulated;
   wherein the at least one electrical contact of the at least one die and the electrical contact of the at least one clip are configured to be positioned to electrically couple with one or more conductive paths comprised in a motherboard, the one or more conductive paths forming a distribution layer;
   wherein the distribution layer is configured to distribute all electrical signals between the semiconductor device package and the motherboard; and
   wherein the semiconductor device package comprises no lead frame.

2. A semiconductor device package comprising:
   a plurality of electrical contacts comprised on a first face of a first die; and
   one of a mold compound and an encapsulating compound comprised around the first die, wherein a portion of the plurality of electrical contacts on the first face of the first die are not one of overmolded and encapsulated;
   wherein the portion of the plurality of electrical contacts on the first face of the first die are configured to be positioned to electrically couple with one or more conductive paths comprised in a motherboard, the one or more conductive paths forming a distribution layer; and
   wherein the distribution layer is configured to distribute all electrical signals between the semiconductor device package and the motherboard;
   wherein the semiconductor device package comprises no lead frame.

3. The semiconductor device package of claim 2, further comprising at least one electrical contact on a first face of a second die; and
   a first clip mechanically and electrically coupled with an electrical contact on a second face of the second die where the second face of the second die is on an opposing side of the second die from the first face of the second die;
   wherein one of a mold compound and an encapsulating compound enclose the second die and a majority of the first clip; and
   wherein the at least one electrical contact on the first face of the second die and the electrical contact of the first clip are not one of overmolded and encapsulated.

4. The semiconductor device package of claim 3, wherein the first clip is one of bonded and soldered to the second face of the second die.

5. The semiconductor device package of claim 3, wherein the distribution layer is configured to distribute all electrical communication among and between each die, each clip and each passive component of the semiconductor device package and to further interconnect one or more components of the semiconductor device package with one or more components external to the semiconductor package through one or more conductive paths of the motherboard.

6. The semiconductor device package of claim 3, further comprising:
   at least one electrical contact on a first face of a third die;
   a second clip mechanically and electrically coupled with an electrical contact on a second face of the third die, the second face of the third die on an opposing side of the third die from the first face of the third die;
   wherein the third die and a majority of the second clip are one of overmolded and encapsulated; and
   wherein the at least one electrical contact on the first face of the third die and the electrical contact of the second clip are not one of overmolded and encapsulated.

7. The semiconductor device package of claim 6, wherein the distribution layer is configured to distribute all electrical communication between the first die, the second die and the third die.

8. The semiconductor device package of claim 6, wherein the second clip is positioned to electrically couple the second die with the third die through the one or more conductive paths comprised in the motherboard.

9. The semiconductor device package of claim 6, wherein the electrical contact of the second clip is positioned to electrically couple with the one or more conductive paths comprised in the motherboard.

10. The semiconductor device package of claim 2, wherein the semiconductor device package comprises no wire bonds.

11. The semiconductor device package of claim 2, wherein the distribution layer is configured to distribute a majority of electrical signals between the plurality of electrical contacts on the first face of the first die.

12. A semiconductor device package comprising:
a plurality of electrical contacts on a first face of one of a first die;
a passive component;
one of a mold compound and an encapsulating compound comprised around the first die and passive component, wherein a portion of the plurality of electrical contacts on the first face of one of the first die and passive component are not one of overmolded and encapsulated;
wherein the portion of the plurality of electrical contacts on the first face of one of the first die and passive component are configured to be positioned to electrically couple with one or more conductive paths comprised in a motherboard, the one or more conductive paths forming a distribution layer;
wherein the distribution layer is configured to distribute all electrical signals between the semiconductor package and the motherboard; and
wherein the semiconductor device packages comprises no lead frame.

13. The semiconductor device package of claim 12, further comprising no wire bonds.

14. A semiconductor device package, consisting essentially of:
a plurality of electrical contacts on a first face of a die;
at least one clip electrically and mechanically coupled with at least one electrical contact on a second face of the die, the second face of the die on an opposing side of the die from the first face of the die, the at least one clip comprising at least one lead in electrical communication with the at least one electrical contact on the second face of the die; and
one of a mold compound and an encapsulating compound comprised around the die and a majority of the at least one clip, wherein a portion of the at least one lead and a portion of the plurality of electrical contacts on the first face of the die are not one of overmolded and encapsulated;
wherein the semiconductor package comprises no lead frame.

15. The semiconductor device package of claim 14, wherein the plurality of electrical contacts on the first face of the die comprise one of pads and bumps.

16. The semiconductor device package of claim 14, wherein the semiconductor device package comprises no wire bonds.

17. The semiconductor device package of claim 14, wherein the at least one clip is mechanically coupled with the at least one electrical contact through of one bonding and soldering on the second face of the die.

* * * * *